US010763877B2

(12) United States Patent
Darthenay

(10) Patent No.: US 10,763,877 B2
(45) Date of Patent: Sep. 1, 2020

(54) APPARATUS FOR DETERMINING CALIBRATION VALUES OF AN ADC

(71) Applicant: NXP B.V., Eindhoven (NL)

(72) Inventor: Frederic Darthenay, Luc sur Mer (FR)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 16/425,049

(22) Filed: May 29, 2019

(65) Prior Publication Data
US 2019/0379387 A1    Dec. 12, 2019

(30) Foreign Application Priority Data

Jun. 8, 2018 (EP) .................................... 18305701

(51) Int. Cl.
 *H03M 1/10* (2006.01)
(52) U.S. Cl.
 CPC ................. *H03M 1/1028* (2013.01)
(58) Field of Classification Search
 CPC ............. H03M 1/1028; H03M 1/1215; H03M 1/0636; H03M 1/10; H03M 1/1009; H03M 1/1071; H03M 2201/63; H03M 3/38
 USPC .................................................. 341/155, 120
 See application file for complete search history.

(56) References Cited

U.S. PATENT DOCUMENTS

| | | | |
|---|---|---|---|
| 6,147,631 A * | 11/2000 | Maulik | .................. H03M 3/35 341/122 |
| 6,351,228 B1 | 2/2002 | Kutsuno et al. | |
| 6,900,750 B1 | 5/2005 | Nairn | |
| 7,379,831 B1 | 5/2008 | Tsyrganovich | |
| 7,541,952 B1 | 6/2009 | Sankaran et al. | |
| 7,825,837 B1 | 11/2010 | Khasnis et al. | |
| 8,330,631 B2 * | 12/2012 | Kumar | ................ H03F 3/45475 341/118 |
| 8,604,953 B2 | 12/2013 | Ali | |
| 8,742,970 B2 * | 6/2014 | Lesso | ...................... H03M 1/34 341/157 |

(Continued)

FOREIGN PATENT DOCUMENTS

EP    3001568 A2    3/2016

OTHER PUBLICATIONS

Janssen et al.: "An 11b 3.6GS/s Time-Interleaved SAR ADC in 65nm CMOS", ISSCC 2013 / Session 26 / High-Speed Data Converters / 26.2, Digest of Technical Papers, 2013 IEEE International Solid-State Circuits Conference, pp. 464-465.

(Continued)

*Primary Examiner* — Jean B Jeanglaude

(57) ABSTRACT

An apparatus for determining one or more calibration values of an ADC is configured to receive a first reference signal and a second reference signal and apply to the ADC the following: over a first signal application period, a first ADC input signal including the first reference signal; over a second signal application period, a second ADC input signal having a substantially equal magnitude and an inverse polarity to the first ADC input signal; over a third signal application period, a third ADC input signal including the second reference signal; and over a fourth signal application period, a fourth ADC input signal having a substantially equal magnitude and an inverse polarity to the third ADC input signal. The apparatus is configured to determine the one or more calibration values based, at least in part, on an ADC output signal of the ADC over the four signal application periods.

15 Claims, 9 Drawing Sheets

(56) References Cited

U.S. PATENT DOCUMENTS

| | | | |
|---|---|---|---|
| 8,953,950 B2* | 2/2015 | Nazarathy | H03M 1/145 |
| | | | 398/188 |
| 9,041,571 B2 | 5/2015 | Wang et al. | |
| 9,088,293 B1 | 7/2015 | D'Souza et al. | |
| 9,106,239 B1* | 8/2015 | Li | H03M 1/0678 |
| 9,106,249 B1 | 8/2015 | Dyer et al. | |
| 9,496,884 B1 | 11/2016 | Azenkot et al. | |
| 9,705,520 B1* | 7/2017 | Kumar | H03M 1/0863 |
| 10,027,343 B2* | 7/2018 | Kumar | H03M 1/164 |
| 2007/0069937 A1 | 3/2007 | Balakrishnan et al. | |
| 2008/0024338 A1 | 1/2008 | Huang et al. | |
| 2012/0119930 A1* | 5/2012 | Kumar | H03F 3/45475 |
| | | | 341/118 |

OTHER PUBLICATIONS

Razavi, Behzad, "Problem of Timing Mismatch in Interleaved ADCs", Custom Integrated Circuits Conference (CICC), Sep. 9, 2012, pp. 1-8, IEEE, Piscataway, NJ, USA.

* cited by examiner

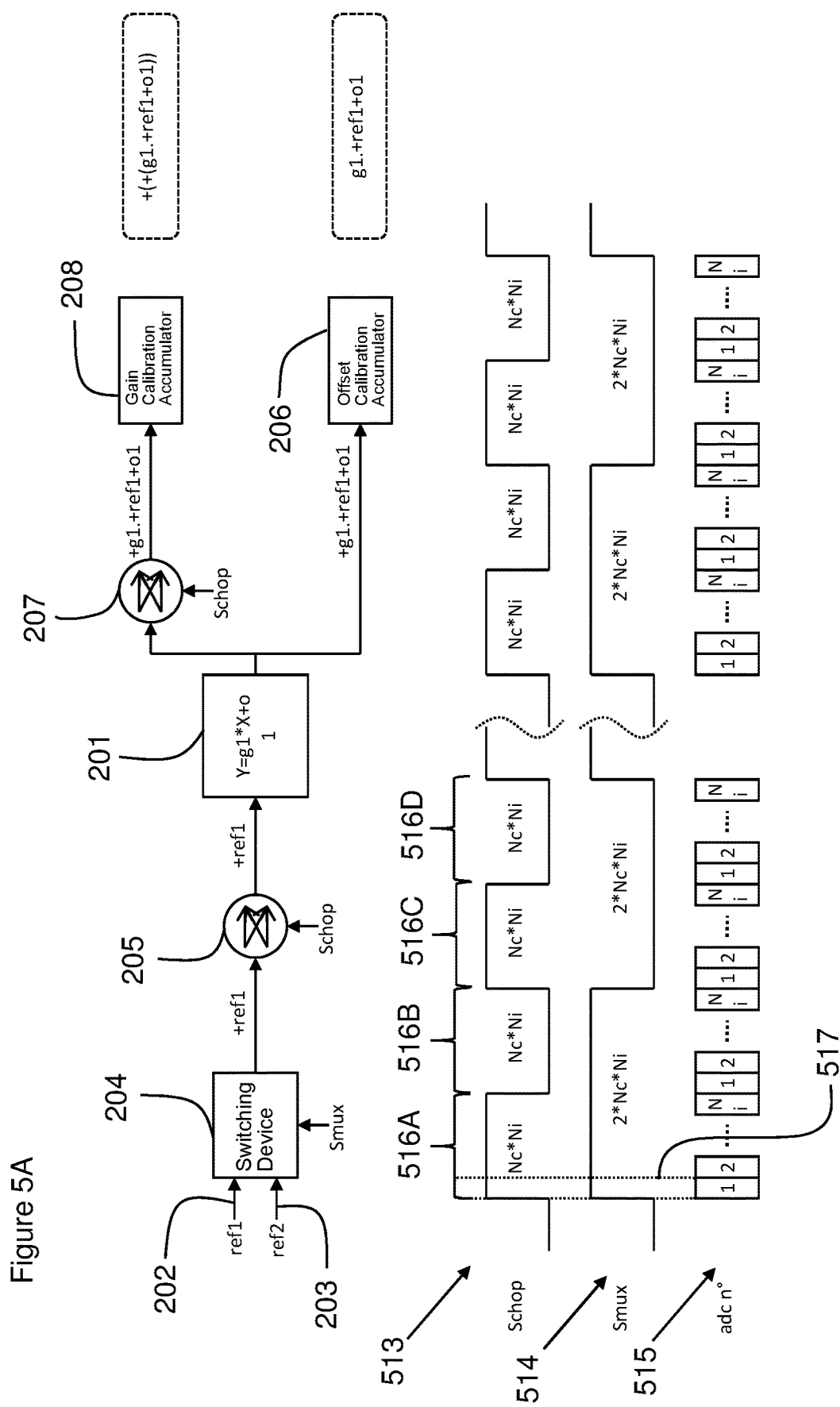

APPARATUS FOR DETERMINING CALIBRATION VALUES OF AN ADC

BACKGROUND

The present disclosure relates to an apparatus for determining one or more calibration values of an analog-to-digital converter (ADC) and a corresponding method. It also relates to a time interleaved ADC system comprising an apparatus for determining the one or more calibration values of an ADC.

SUMMARY

According to a first aspect of the present disclosure, there is provided an apparatus for determining one or more calibration values of an analog-to-digital converter, ADC,
the apparatus configured to receive a first reference signal and a second reference signal and, based on the first reference signal and the second reference signal, apply to the ADC, over four separate signal application periods, the following:
over a first signal application period, a first ADC input signal comprising the first reference signal;
over a second signal application period, a second ADC input signal, the second ADC input signal having a substantially equal magnitude and an inverse polarity to the first ADC input signal;
over a third signal application period, a third ADC input signal comprising the second reference signal; and
over a fourth signal application period, a fourth ADC input signal, the fourth ADC input signal having a substantially equal magnitude and an inverse polarity to the third ADC input signal,
the apparatus configured to determine the one or more calibration values based, at least in part, on an ADC output signal of the ADC over the four signal application periods.

In one or more embodiments, the one or more calibration values may comprise one or more of an offset calibration value and a gain calibration value, wherein: (i) the offset calibration value may be calculated as a sum of the ADC output signal over the four signal application periods; and (ii) the gain calibration value may be calculated as a sum of: (a) a signal comprising one of the ADC output signal over the first signal application period and the ADC output signal over the second signal application period and a signal having a substantially equal magnitude and an inverse polarity to the other of the ADC output signal over the first signal application period and the ADC output signal over the second signal application period; and (b) a signal comprising one of the ADC output signal over the third signal application period and the ADC output signal over the fourth signal application period and a signal having a substantially equal magnitude and an inverse polarity to the other of the ADC output signal over the third signal application period and the ADC output signal over the fourth signal application period.

In one or more embodiments, calculating a sum of a signal may comprise adding a plurality of signals together or, alternatively, may comprise adding some signals together and subtracting other signals from the total. It will be appreciated that subtracting some signals in a sum is mathematically equivalent to inverting the polarity of a signal and adding the inverted signal to a total.

In one or more embodiments, the first signal application period may be substantially equal in duration to the second signal application period. In one or more embodiments, the third signal application period may be substantially equal in duration to the fourth signal application period. In one or more embodiments, each of the signal application periods may be substantially equal in duration.

In one or more embodiments, each of the first through fourth signal application periods may have a corresponding duration; the ADC may have a sampling period; and the duration of each of the first through fourth signal application periods may be equal to at least two signal sampling periods of the ADC.

In one or more embodiments, the ADC may comprise a plurality of sub-ADCs, wherein: during the first signal application period, the apparatus is configured to provide the first ADC input signal to each of the plurality of sub-ADCs and to receive the ADC output signal from each of the sub-ADCs; during the second signal application period, the apparatus is configured to provide the second ADC input signal to each of the plurality of sub-ADCs and to receive the ADC output signal from each of the sub-ADCs; during the third signal application period, the apparatus is configured to provide the third ADC input signal to each of the plurality of sub-ADCs and to receive the ADC output signal from each of the sub-ADCs; and during the fourth signal application period, the apparatus is configured to provide the fourth ADC input signal to each of the plurality of sub-ADCs and to receive the ADC output signal from each of the sub-ADCs.

In one or more embodiments, the plurality of sub-ADCs may comprise the sub-ADCs of a time interleaved ADC system. In one or more embodiments, the time interleaved ADC system may be comprised as part of one or more of a radio, such as a high bandwidth radio, a WiFi device or another electronic device in which high transmission rates are advantageous.

In one or more embodiments, the switching device may be configured to receive the first reference signal and the second reference signal, the switching device configured to provide a switching device output signal wherein, over the first and second signal application periods, the switching device output signal comprises the first reference signal and over the third and fourth signal application periods, the switching device output signal comprises the second reference signal.

In one or more embodiments, the switching device may comprise a multiplexer. In one or more embodiments, the multiplexer may be configured to switch between the first reference signal and the second reference signal based receipt of a switching device control signal.

In one or more embodiments, the apparatus may comprise a first signal inverting element configured to provide each of the ADC input signals based on the switching device output signal wherein: during the second signal application period, the first signal inverting element may be configured to provide the second ADC input signal by inverting the polarity of the first reference signal received from the switching device; and during the fourth signal application period, the first signal inverting element may be configured to provide the fourth ADC input signal by inverting the polarity of the second reference signal received from the switching device.

In one or more embodiments, the first signal inverting element may comprise a first chopper configured to provide an output, comprising one of the second and fourth ADC input signals, that is of the opposite polarity to its respective input comprising a respective one of the first or the second reference signal. In one or more embodiments, the first signal inverting element may be configured such that, during the first and third signal application periods, the first signal inverting element does not invert the polarity of the first or second reference signals received from the switching device. In one or more embodiments, the apparatus may comprise a first bypass element which is configured to bypass the first signal inverting element during the first and third signal application periods such that neither the first reference signal nor the second reference signal are inverted by the first inverter element. During the second and fourth signal application periods, the bypass element is configured not to bypass the first signal inverting element such that both the first and second reference signals are inverted by the first inverter element.

In one or more embodiments, the apparatus may comprise a second signal inverting element configured to provide a gain calibration signal, for use in determination of one of the calibration values, based on the ADC output signal wherein: during one of the first and the second signal application period, the second signal inverting element may be configured to provide the gain calibration signal by inverting the polarity of the ADC output signal; and during one of the third and the fourth signal application period, the second signal inverting element is configured to provide the gain calibration signal by inverting the polarity of the ADC output signal.

In one or more embodiments, the second inverting element may comprise a second chopper configured to provide an output, comprising one of the second and fourth ADC input signals, that is of the opposite polarity to its respective input comprising a respective one of the first or the second reference signal. In one or more embodiments, the second signal inverting element may be configured such that, during the other of the first or second application periods and the other of the third and fourth signal application periods, the second signal inverting element does not invert the polarity of the ADC output signal received from the ADC. In one or more embodiments, the apparatus may comprise a second bypass element which is configured to bypass the second signal inverting element during the first and third signal application periods such that the ADC output signal is not inverted by the second inverting element. During the second and fourth signal application periods, the bypass element may be configured not to bypass the second signal inverting element such that both the first and second reference signals are inverted by the second inverter element. In one or more examples, the second bypass element may be provided independently of the first bypass element.

In one or more embodiments, the apparatus may comprise a gain calibration accumulator configured to sum the gain calibration signal over the four signal application periods in order to provide for the gain calibration value. In one or more embodiments, the gain calibration accumulator may accumulate the signals received by the gain calibration accumulator by summing over the first through fourth signal application periods. In one or more embodiments, the gain calibration accumulator may be configured to compute the gain calibration value based, at least in part, on the signals accumulated by the gain calibration accumulator over the first through fourth signal application periods. In one or more embodiments, the gain calibration accumulator may be configured to perform averaging of the sum of the ADC output signal over the four signal application periods over a plurality of cycles of the four signal application periods in order to provide for the gain calibration value.

In one or more embodiments, where there are a plurality of sub-ADCs, each sub-ADC may be connectable a respective gain calibration accumulator.

In one or more embodiments, the apparatus may comprise an offset calibration accumulator configured to sum the offset calibration signal over the four signal application periods in order to provide for the offset calibration value. In one or more embodiments, the offset calibration accumulator may accumulate, by summing, the signals received by the offset calibration accumulator over the first through fourth signal application periods. In one or more embodiments, the offset calibration accumulator may be configured to compute the offset calibration value based, at least in part, on the signals accumulated by the offset calibration accumulator over the first through fourth signal application periods. In one or more embodiments, the offset calibration accumulator may be configured to perform averaging of the sum of the ADC output signal over a plurality of cycles of the four signal application periods in order to provide for the offset calibration value.

In one or more embodiments, where the ADC comprises a plurality of sub-ADCs, each sub-ADC may be connectable to a respective gain calibration accumulator.

In one or more embodiments, the apparatus may comprise a controller configured to compute the one or more calibration values based, at least in part, on the signals accumulated by one or more of the gain calibration accumulator and the offset calibration accumulator. In one or more embodiments, the controller may be configured to average the one or more calibration values over a plurality of cycles of the first through fourth signal application periods. In one or more embodiments, the controller may be configured to provide for control of the ADC based on the determined one or more calibration values.

According to a second aspect of the present disclosure, there is provided an ADC system comprising the apparatus of the first aspect and a plurality of sub-ADCs, wherein each of the plurality of sub-ADCs is configured to be selectively provided with an input signal during operation and are collectively configured to provide for time interleaved analog-to-digital conversion of the input signal by use of the sub-ADCs and at least one of the sub-ADCs is further configured to be provided with the first through fourth ADC input signals during a calibration operation.

In one or more embodiments, the apparatus may be configured to provide each of the sub-ADCs of the plurality of sub-ADCs with the first through fourth ADC input signals of the apparatus during the calibration operation.

In one or more embodiments, during operation, the apparatus may be configured to select which of the plurality of sub-ADCs to provide the input signal to at random and, during the calibration operation, the apparatus may be configured to provide each of the sub-ADCs with the first through fourth ADC input signals according to a predetermined sequence.

According to a third aspect of the present disclosure, there is provided a method for determining one or more calibration values of an analog-to-digital converter, ADC, the method comprising:

receiving a first reference signal and a second reference signal and, based on the first reference signal and the second reference signal, applying to the ADC, over four separate application periods, the following:

over the first signal application period, a first ADC input signal comprising the first reference signal;

over a second signal application period, a second ADC input signal, the second ADC input signal having a substantially equal magnitude and an inverse polarity of the first ADC input signal;

over a third signal application period, a third ADC input signal comprising the second reference signal; and over a fourth signal application period, a fourth ADC input signal, the fourth ADC input signal having a substantially equal magnitude and an inverse polarity to the third ADC input signal, summing an ADC output signal of the ADC over the four signal application periods, and determining the one or more calibration values based, at least in part, on a sum of the ADC output signal over the four signal application periods.

In one or more embodiments, the one or more calibration values may comprise one or more of an offset calibration value and a gain calibration value, wherein the method may further comprise the steps of:

(i) determining the offset calibration value based on a sum of the ADC output signal over the four signal application periods; and (ii) determining the gain calibration value based on a sum of:

a) a signal comprising one of the ADC output signal over the first signal application period and the ADC output signal over the second signal application period and a signal having a substantially equal magnitude and an inverse polarity to the other of the ADC output signal over the first signal application period and the ADC output signal over the second signal application period; and b) a signal comprising one of the ADC output signal over the third signal application period and the ADC output signal over the fourth signal application period and a signal having a substantially equal magnitude and an inverse polarity to the other of the ADC output signal over the third signal application period and the ADC output signal over the fourth signal application period.

In one or more embodiments, the ADC may comprise a sub-ADC, the sub-ADC comprising one of a plurality of sub-ADCs, wherein the method further comprises the step of, during the first signal application period, providing the first ADC input signal to each of the plurality of sub-ADCs and receiving the ADC output signal from each of the sub-ADCs;

during the second signal application period, providing the second ADC input signal to each of the plurality of sub-ADCs and receiving the ADC output signal from each of the sub-ADCs;

during the third signal application period, providing the third ADC input signal to each of the plurality of sub-ADCs and to receiving the ADC output signal from each of the sub-ADCs; and during the fourth signal application period, providing the fourth ADC input signal to each of the plurality of sub-ADCs and receiving the ADC output signal from each of the sub-ADCs.

According to a fourth aspect of the present disclosure, there is provided a computer readable medium comprising instructions for carrying out the steps of the third aspect.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which:

FIGS. 5A-5D show an example embodiment of an apparatus of FIG. 2 in operation over the course of a first, second, third and fourth signal application period;

DETAILED DESCRIPTION

Analog-to-digital converters (ADCs) can suffer from timing, offset and gain impairments during their lifetimes. These impairments can be a particular problem for time interleaved ADC systems, which utilise several ADCs operating in parallel to process data streams at increased rates as compared to using a single ADC. While the present disclosure discusses an apparatus and a method primarily with reference to a time interleaved ADC system, it will be appreciated that the apparatus and method described herein may be advantageous for other systems comprising one or more ADCs for which calibration is required or beneficial.

Figure 1:
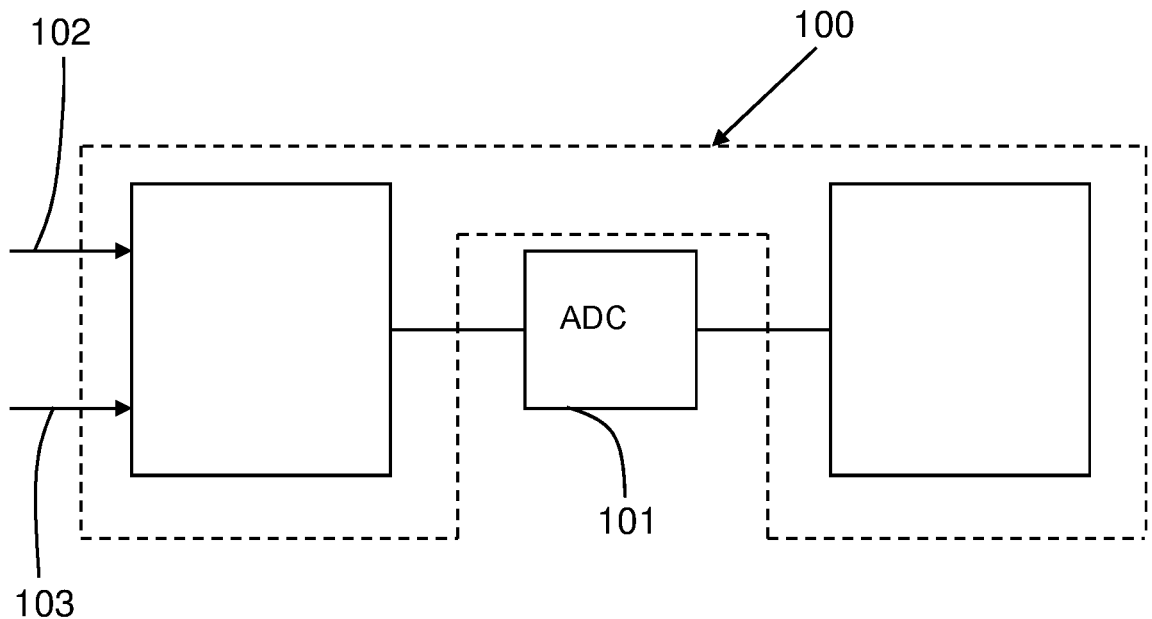
FIG. 1 shows an example embodiment of an apparatus according to the present disclosure coupled to an ADC.

FIG. 1 shows an example embodiment of an apparatus 100 according to the present disclosure coupled to an ADC 101. The apparatus 100 is configured to provide for determination of one or more calibration values of the ADC 101. For example, the apparatus 100 may be configured to provide for determination of an offset calibration value of the ADC 101 or a gain calibration value of the ADC 101. In some embodiments, the apparatus 100 may provide for the determination of both a gain calibration value and an offset calibration value. In one or more examples, the ADC may have a gain error in terms of an amplification gain applied thereby and the gain calibration value may be configured to compensate for said gain error. Likewise, the ADC may have an offset error, such as in terms of a mean value of its output, and the offset calibration value may be used to compensate for said offset error by providing for determination of a bias signal for said ADC.

The apparatus 100 is configured to receive a first reference signal 102 and a second reference signal 103 and, based on these reference signals 102, 103, provide four, different, ADC input signals to the ADC 101 over four signal application periods. In some embodiments, the four ADC input signals may be applied successively over four separate signal application periods with no interruption between applications. In other embodiments, the signals may be interspaced with periods during which either no signals are applied or additional signals are applied. Over a first signal application period, a first ADC input signal is provided to the ADC 101 which comprises the first reference signal 102. Over a second signal application period, a second ADC input signal is provided to the ADC 101. The second ADC input signal has a substantially equal magnitude and inverse polarity to the first ADC input signal, i.e. the second ADC input signal has a substantially equal magnitude and an inverse polarity to the first reference signal 102. Thus, mathematically, the sign of the first and the second ADC input signals is opposite. Over a third signal application period, a third ADC input signal is provided to the ADC 101 which comprises the second reference signal 103. Over a fourth signal application period, a fourth ADC input signal is provided to the ADC 101. The fourth ADC input signal has a substantially equal magnitude and inverse polarity to the third ADC input signal, i.e. the fourth ADC input signal has a substantially equal magnitude and an inverse polarity to the second reference signal 103. Thus, mathematically, the sign of the third and the fourth ADC input signals is opposite.

Although it is intended that the second ADC input signal comprises an equal magnitude and an inverse polarity to the first ADC input signal, it will be appreciated that the magnitudes of the two signals may not be exactly equal. For example, one of the first and second ADC input signals may be subject to modulation which the other is not. This may provide for some small variation in the magnitudes of the signals, however, calibration values may still be calculated where the difference caused by the modulation is not large. In the same way, the magnitudes may not be equal due to artefacts introduced by a means used to invert the polarity of the second ADC input signal. Alternatively, or in addition, noise introduced into one or both of the first and second ADC input signals may also result in the magnitudes of these signals not being equal. As previously stated, as long as these variations are not above a predetermined acceptable error threshold, calibration values can still be accurately determined. The same points are equally applicable to deviations from precisely equal magnitudes between the third and fourth ADC input signals.

The second and fourth ADC input signals are described as having an inverse polarity to the first and third ADC input signals, respectively. It will be appreciated that this inverse polarity may be inverse when considered about zero, about a ground voltage value, or about another value considered to be a mid-point of the signal.

In one or more examples, the first and second reference signals are DC signals or non-time-varying. In one or more embodiments, the first and second reference signals may be time varying and the difference between the first and second reference signals may be time invariant. It will be appreciated that in one or more examples, the first and second reference signals are time-varying, but the variation is sufficiently small that over the first to fourth signal application periods, the determination of the calibration value(s) is not significantly affected by said time variation.

It will be appreciated that the signal application periods are labelled "first", "second", "third" and "fourth" for convenience and that this implies no limitation on the order in which the input signals are applied to the ADC 101. For example, the fourth ADC input signal may be provided to the ADC 101 followed by the second ADC input signal, followed by the first ADC input signal, followed by the third ADC input signal or in any other order. The signals are applied to the ADC alternately such that, over the course of four signal application periods, each of the first, second, third and fourth ADC signals are individually provided to the ADC 101. It will also be appreciated that in one or more examples, the signal application periods need not be consecutive.

After processing of an ADC input signal by the ADC 101, the apparatus 100 is then configured to determine the one or more calibration values of the ADC 10 based, at least in part, on an average of an ADC output signal of the ADC over the four signal application periods. The ADC 101 performs its function of converting the signals from an analog signal to a digital signal on each of the four ADC input signals. It will be appreciated that the ADC 101 inherently applies its own gain and offset to the signals. By processing the average of these signals, or the average of signals based on these output signals, calibration values for the offset and/or the gain of the ADC 101 can be obtained. The calibration values may be used to control the ADC 101 to compensate for any gain or offset applied by the ADC 101 that is determined to be irregular.

With reference to FIG. 1, the ADC 101 may not comprise a part of the apparatus 100. The apparatus 100 is configured to be connectable to the ADC 101 such that it can provide signals thereto and receive signals therefrom. This may be particularly advantageous in systems wherein it is desirable for a single apparatus 100 to be connectable to any of a plurality of ADCs in order to determine calibration values of each of the plurality of ADCs. Such an example will be described below in relation to FIGS. 3 and 4. In one or more other embodiments, the apparatus 100 may also comprise the ADC 101. In such embodiments, where there is also a plurality of ADCs, each of the ADCs may be connected to a corresponding apparatus for determining one or more calibration values of the respective ADC 101.

This apparatus 100 may be advantageous, as it may determine one or more calibration values using only two input reference signals 102, 103 applied to the ADC. In particular, the apparatus 100 may be capable of determining more than one calibration value using the same two input reference signals 102, 103 simultaneously, thereby providing for a more efficient apparatus 100 for determining calibration values of an ADC.

In some examples, the calibration values that the apparatus 100 is be configured to determine may be the offset calibration value and the gain calibration value. The offset may be defined as the voltage offset applied to any signal processed by the ADC 101. For example, if the ADC 101 processes the first reference signal 102, REF1, the resultant ADC output signal provided by the ADC 101 may be REF1+o1, where o1 is the offset introduced by the ADC 101. The offset calibration value may be calculated based on an average of the ADC output signal over the four signal application periods. The details of time averaging of the ADC output signals to provide the offset calibration value will be discussed with reference to FIGS. 5A-5D.

The gain calibration value may be the multiplicative gain applied to any signal processed by the ADC 101. For example, if the ADC processes the first reference signal, REF1, the resultant offset signal processed by the ADC 101 may be g1·REF1, where g1 is the gain applied by the ADC to a signal processed thereby. The details of the time averaging of the signals based on the ADC output signals to provide the gain calibration value will be discussed with reference to FIGS. 5A-5D. In one or more examples, the gain calibration value may be defined as the difference between the intended gain to be applied by the ADC and the actual gain applied be the ADC.

Figure 2:
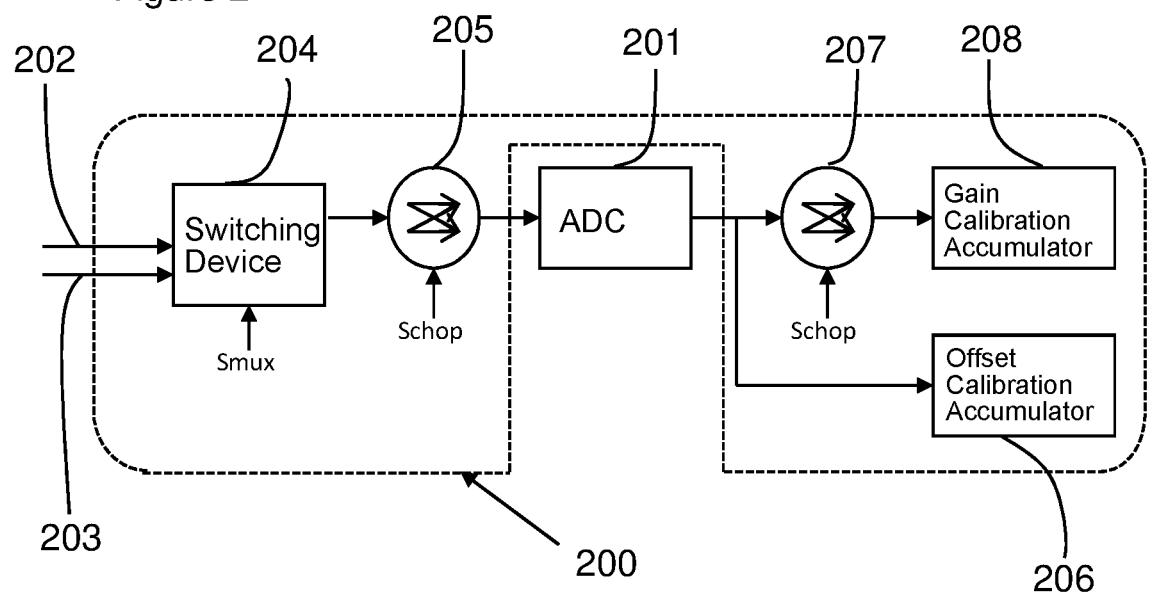
FIG. 2 shows an example embodiment of a further apparatus according to the present disclosure coupled to an ADC.

FIG. 2 shows a specific embodiment of the apparatus 200 of the present disclosure. In the example of FIG. 2, the first reference signal 202 and the second reference signal 203 are received by a switching device 204. The switching device 204 is configured to provide, at its output, one of the first reference signal 202 and the second reference signal 203 based on a control signal which controls the configuration of the switching device. In some examples, the switching device 204 may comprise a multiplexer controlled by a multiplexer control signal, Smux. The control signal may comprise a clock signal, for example, which may be generated by a clock signal generator. The clock signal generator may comprise part of the apparatus 200, or the clock signal may be received by the apparatus 200 from elsewhere. It will be appreciated that the switching device 204 may be any device, element, or collection of electronic components which allow for switching an output signal between the first reference signal 202 and the second reference signal 203.

In this example, the switching device 204 is configured to provide a switching device output signal where, over the first and second signal application periods, the switching device output signal comprises the first reference signal 202 and over the third and fourth application periods, the switching device output signal comprises the second reference signal 203. It will be appreciated that some noise may be introduced into the switching device output signal as a result of processing by the switching device 204, however, the switching device output signal is configured to be substantially equal to the first or second reference signal 202, 203.

As shown in FIG. 2, the switching device output signal is provided to a first signal inverting element 205. The first signal inverting element 205 is configured to invert the polarity of a received input signal, in this case the received input signal being the switching device output signal.

In this embodiment, the first signal inverting element 205 comprises a chopper configured to provide an output, comprising one of the second and fourth ADC input signals, that is of the opposite polarity to its respective input comprising a respective one of the first or the second reference signal. Alternatively, the first signal inverting element 205 may comprise any element, or collection of electronic components which are capable of inverting the polarity of a received input signal.

In particular, the first signal inverting element 205 is configured to, during the second signal application period, provide the second ADC input signal by inverting the polarity of the first reference signal 202 received from the switching device 204 and, during the fourth signal application period, provide the fourth ADC input signal by inverting the polarity of the second reference signal 203 received from the switching device 204. In other embodiments, the first signal inverting element 205 may be configured to invert the polarity of any signal provided to it and, during the first and third signal application periods, the first and third ADC input signals may be provided to the ADC 201 by causing the switching device output signal to bypass the first inverting element 205. In such an embodiment, during the second and fourth signal application periods, the first signal inverting element 205 may not be bypassed and, as such, the polarity of the switching device output signal may be inverted in order to provide the second and fourth ADC input signals.

The first signal inverting element 205 may be configured to switch between a signal inverting mode, in which the polarity of a received signal is inverted and provided to its output, and a non-signal inverting mode, wherein the polarity of a signal passing therethrough is left unchanged between the input and the output of the first switching element 205. Switching between the signal inverting mode and the non-signal inverting mode may be controlled by a first switching element control signal, such as by a clock signal. In said other embodiments, the first signal inverter element 205 may be configured to be bypassed, the control of whether the first signal inverter element 205 is bypassed being provided for by a first switching element control signal, such as a clock signal. In general, the apparatus 200 may be configured to provide for changing of the polarity of the received signal using a control signal provided to the first signal inverting element 205.

Thus, by the combined application of the switching device 204 and the first inverting element 205, the ADC 201 is provided with the first, second, third and fourth ADC input signals. It will be appreciated that alternative methods of providing the first, second, third and fourth ADC input signals may be available to the skilled person, however, the combination of the switching device 204 and the first inverting element 205 provides for a particularly simple configuration for obtaining the four desired ADC input signals based on only the first and second reference signals 202, 203.

Upon receipt of the first, second, third and fourth ADC input signals, the ADC 201 will process these signals in order to provide the ADC output signal, which is received by the apparatus 201.

In some examples, an offset calibration accumulator 206 may receive the ADC output signals over the first, second, third and fourth signal application periods and, by accumulation of these signals, as will be described in more detail below, provide for the determination of an offset calibration value. In some embodiments, the offset calibration accumulator 206 may be configured to perform all necessary operations to determine an offset calibration value, including performing any required mathematical operations and, optionally, performing averaging of the accumulated signals over a plurality of signal application cycles, if measurements have been taken over a plurality of cycles. The offset calibration value may be provided to a controller configured to control the operation of the ADC. In other embodiments, the offset calibration accumulator 206 may only be configured to accumulate the ADC output signals and provide the accumulated signals to a controller, wherein the controller is configured to perform any additional required operations for the determination of the offset calibration value, such as mathematical operations and, optionally, time averaging. The controller may comprise a part of the apparatus 201, or may not comprise a part of the apparatus 201 and, instead, may be configured to receive signals from the apparatus 201 for the determination of an offset calibration value based on the results of the offset calibration accumulator 206. Where the offset calibration accumulator 206 and/or the gain calibration accumulator 208 do not perform the mathematical operation, the controller may comprise part of the apparatus, in order to determine the offset calibration value and/or the gain calibration value. Where the controller is not used to perform the mathematical operation, the controller need not comprise part of the apparatus. The controller may be configured to perform the mathematical operation by way of a hardware arrangement or by executing software which performs the mathematical operation.

In one or more examples, in order to provide for determination of the gain calibration value, the apparatus 200 is configured to provide for inversion of the polarity the ADC output signal during one of the first and second signal application periods and also during one of the third and fourth signal application periods. In order to provide for this inversion of signal polarities, a second signal inverting element 207 may be provided, the second signal inverting element 207 configured to, during one of the first and second signal application periods and during one of the third and fourth signal application periods, provide a gain calibration signal based on the ADC output signal. During the other of the first and second signal application period and the third and fourth signal application period, the second signal inverting element 207 may be configured to not alter the polarity of the ADC output signal. Alternatively, the apparatus 200 may be configured such that, during one of the first and second signal application period and one of the third and fourth signal application period, the ADC output signal is provided to the second signal inverter element 207 and during the other of the first and second signal application period and the third and fourth signal application period, the second signal inverter element 207 is bypassed by the ADC output signal.

The second signal inverting element 207 may be configured to switch between a signal inverting mode, in which the polarity of a received signal is inverted and provided to its output, and a non-signal inverting mode, wherein the polarity of a signal passing therethrough is left unchanged between the input and the output of the second switching element 207. Switching between the signal inverting mode and the non-signal inverting mode may be controlled by a second inverting element control signal, such as by a clock signal. In other embodiments, the second signal inverting element 207 may be configured to be bypassed, the control of whether the second signal inverting element 207 is bypassed being provided for by a second switching element control signal, such as a clock signal. The clock signal which controls the second signal inverting element 207 may be the same clock signal that controls the first signal inverting element 205, or it may be a different signal. In general, the apparatus 200 may be configured to provide for changing of the polarity of the signal received by the second signal inverting element 207 using a control signal provided to the second signal inverting element 207 during particular signal application periods.

In the example of FIG. 2, a gain calibration accumulator 208 is provided which receives the gain calibration signal from the second signal inverting element 207. The gain calibration accumulator 208 may be configured to accumulate the gain calibration signal over the first, second, third and fourth signal application periods, i.e. one signal application cycle, as described in more detail below, and, by accumulation of these signals and performing a mathematical operation, provide for determination of a gain calibration value of the ADC. In some embodiments, the gain calibration accumulator 208 may be configured to perform all necessary operations to determine a gain calibration value, such as mathematical operations or time averaging of the accumulated signal. The result of the gain calibration accumulator 208 may be provided to a controller. In other embodiments, the gain calibration accumulator 208 may only be configured to accumulate the gain calibration signal and provide the accumulated signal to a controller, wherein the controller is configured to perform any additional required operations, such as mathematical operations and/or time averaging, for the determination of the gain calibration value. The controller may comprise a part of the apparatus 200, or may not comprise a part of the apparatus 200 and, instead, may be configured to receive signals from the apparatus 200 for the determination of a gain calibration value based on the results of the gain calibration accumulator 208. The controller may be the same controller as is connected to the offset calibration accumulator 206, or it may be a different controller. Where the gain calibration accumulator and the gain calibration accumulator does not perform the mathematical operation, the controller may comprise part of the apparatus, in order to determine the gain calibration value. Where the controller is not used to perform the mathematical operation, the controller need not comprise part of the apparatus.

The ADC 201 may be configured to operate in an operation mode and in a calibration mode. In the calibration mode, the ADC 201 may be configured to be connected to the apparatus 200 and to, thereby, receive the first and second reference signals 202, 203, as described in detail above. In the operation mode, the ADC 201 may be configured to receive an input signal, different from either of the first reference signal 202 or the second reference signal 203, for conversion from an analog signal to a digital signal.

The one or more controllers which receive the offset and gain calibration values may be configured to provide for control of the ADC 201 based on the determined offset and gain calibration values. For example, a controller may be configured to control the level of gain or offset applied by the ADC during the operation mode based on the one or more calibration values determined during the calibration mode.

Figure 3:
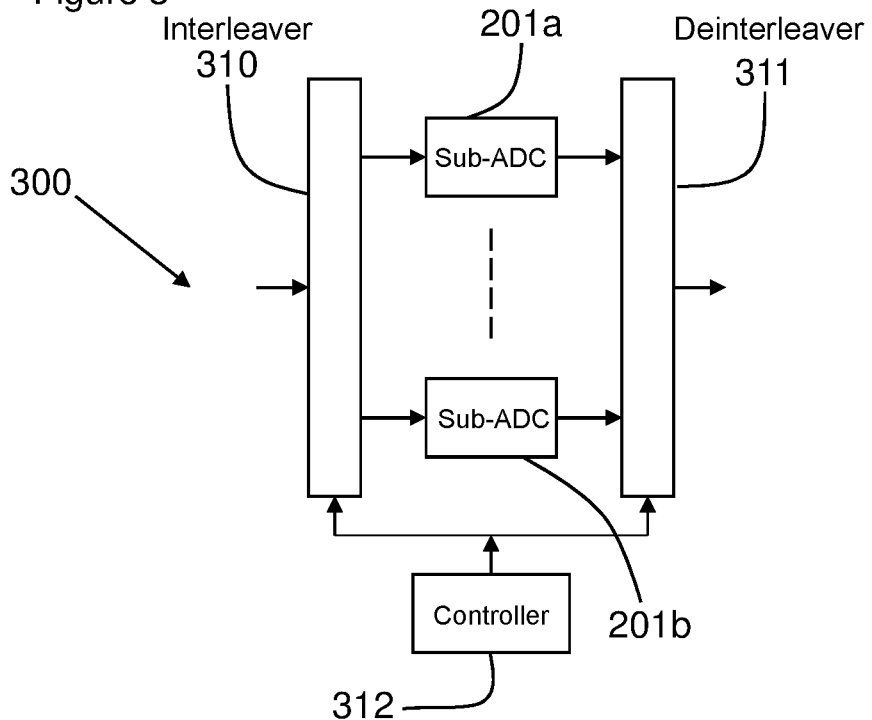
FIG. 3 shows an example embodiment of a time interleaved ADC system according to the present disclosure.

FIG. 3 shows a time interleaved ADC system 300. The time interleaved ADC system is configured to receive an analog signal for conversion to a digital signal. The purpose of a time interleaved ADC 300 is to provide for conversion of an analog signal to a digital signal at increased rates as compared to using a single ADC by using a plurality of sub-ADCs capable of performing parallel processing of portions of the received input signal. An interleaver 310 receives the input signal and apportions discrete segments of the input signal to different sub-ADCs 201a, 201b such that each sub-ADC 201a, 201b can process a segment of the total signal in parallel. On processing its assigned portion, each sub-ADC 201a, 201b transmits the converted signal portion to a deinterleaver 311, which reconstitutes the signal into a single digital output signal. A controller 312 is provided which controls to which sub-ADC 201a, 201b each portion is assigned by the interleaver 310 and correspondingly controls the reconstitution of the signal by the deinterleaver 311. It will be appreciated that, if each of the sub-ADCs 201a, 201b apply different offsets and gains to incoming signals as compared to each other, then the reconstituted signal produced by the deinterleaver 311 may comprise mismatched signal portions or an erroneous output, resulting in a reduced output signal quality. As such, it is desirable for a controller 312 to either be able to control the gain and offset applied by each sub-ADC 201a, 201b based on the measured sub-ADC calibration values or to control the reconstitution performed by the deinterleaver 311 based on the offset and gain calibration values. It will be appreciated that discussions of features relating to sub-ADCs in the examples and the claims may equally correspond to a reference to an ADC. For example, a reference to a ADC output signal may be construed as referring to the or each sub-ADC in a system comprising plurality of sub-ADCs in place of a single ADC.

In some examples, it is advantageous to perform selection of sub-ADCs 201a, 201b for analog input signal digitisation at random. If the selection of sub-ADCs 201a, 201b is not performed at random, then fixed pattern noise may arise, however, using random selection of the sub-ADCs 201a, 201b, then any fixed pattern which would otherwise result can be inhibited.

The sub-ADCs 201a, 201b in a time interleaved ADC system 300 may be switched between, for example, by a multiplexer or another type of switching device. When a sub-ADC 201a, 201b is not receiving or processing a signal portion, it may be idle. In such periods, it may be advantageous to operate the sub-ADC 201a, 201b in a calibration mode. This may be achieved by connecting the apparatus 100, 200 of FIG. 1 or FIG. 2 to the sub-ADC 201a, 201b in order to provide for determination of one or more of the offset and gain calibration values. While it has been discussed that it may be advantageous to assign signal portions of an input signal to sub-ADCs 201a, 201b at random, in some embodiments it may be advantageous to connect to sub-ADCs 201a, 201b for a calibration operation according to a predetermined order, instead of at random. This may provide for a substantially equal time difference between each signal application period for each sub-ADC, which may be advantageous. As such, during the calibration operation, the plurality of sub-ADCs 201a, 201b may be switched between according to a predetermined order. Over the course of each of the first, second, third and fourth signal application periods, each of the sub-ADCs 201a, 201b may operate in the calibration mode sequentially according to the predetermined order. Thus, each sub-ADC 201a, 201b will be connected to the apparatus for operation in a calibration mode at least once during each of the first, second, third and fourth signal application periods. Alternatively, each of the sub-ADCs may be provided with the first through fourth ADC input signals over the first through fourth signal application periods simultaneously. In one or more embodiments, a first subset of sub-ADCs in the plurality of sub-ADCs may be provided with the first ADC input signal simultaneously during a portion of the first signal application period, followed by a second subset of the plurality of sub-ADCs being provided with the first ADC input signal over a latter portion of the first signal application periods. It will be appreciated that there may be any number of subsets of sub-ADCs of the plurality of sub-ADCs and that each subset may comprise any number of the sub-ADCs in the plurality of sub-ADCs. The provision of an ADC input signal to an ADC or sub-ADC may be considered to be equivalent to connecting that ADC to the apparatus during the relevant signal application period. By providing for connection of each sub-ADC to the apparatus, whether sequentially, simultaneously, or any combination thereof, respective gain calibration values and offset calibration values can be determined for each sub-ADC.

Figure 4:
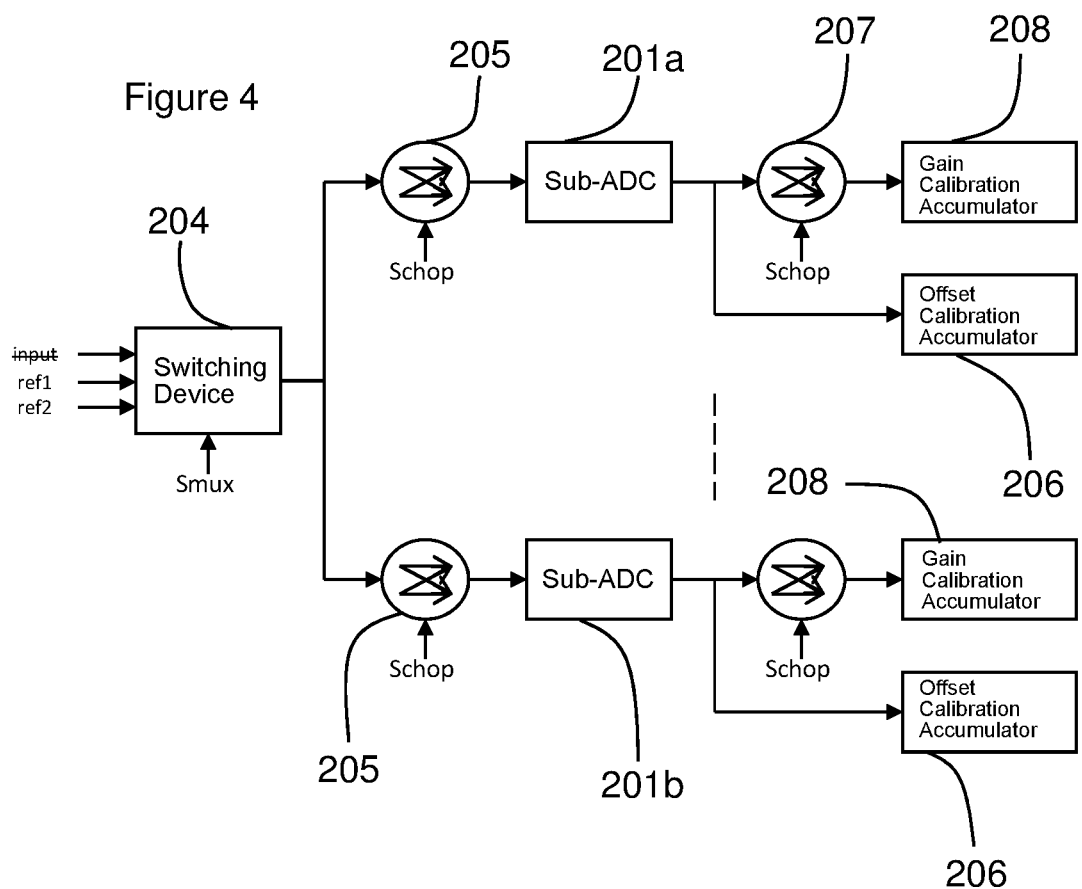
FIG. 4 shows an example embodiment of a further time interleaved ADC system according to the present disclosure.

FIG. 4 shows an embodiment wherein a plurality of sub-ADCs 201a, 201b are each connectable to an apparatus 200a, 200b such as that shown in FIG. 2. In this embodiment, the switching device 204 is common to each of the sub-ADCs, however, each of the first and second signal inverting elements 205, 207 and calibration accumulators 206, 208 are specifically assigned to a particular sub-ADC 201a, 201b. In other embodiments, it will be appreciated that common inverting elements and/or common accumulators may be provided for all or some of the sub-ADCs 201a, 201b, which may provide for the advantage of reduced components. Providing separate gain and offset calibration accumulators for each sub-ADC may assist in avoiding time delays in calculating the respective calibration values. The common switching device 204 may be the switching device of the interleaver 310. In such an embodiment, the switching device 204 may be configured to provide for switching between an input signal for analog to digital conversion, a first reference signal 202 and a second reference signal 203. As such, the switching device 204 may be configured to provide the input signal to the sub-ADCs 201a, 201b at random or in a predetermined order during an operation mode and sequentially provide the first and second reference signals 202, 203 during a calibration mode.

The operation of an example embodiment of the present disclosure will now be provided with reference to FIGS. 5A-5D. Each of FIGS. 5A-5D show a single ADC 201 as presented in FIG. 2 which may comprise a sub-ADC of a plurality of sub-ADCs in a time interleaved ADC system 300 as presented in FIGS. 3 and 4. Two control signal diagrams and show the inverting element control signal 513 and the switching device control signal 514, Schop and Smux, respectively, which are applied to the first inverting element 205 and the switching device 204, respectively. A timing diagram 515 shows the duration over which each of a plurality of sub-ADCs are connected to the apparatus 200. The inverting element control signal diagram shows the switching of the first inverting element 205 between a non-inverting mode of operation and an inverting mode of operation. In particular, it shows the inverting element control signal applied to the first inverting element 205 to affect the switching mode of operation. In this example, the inverting element control signal also controls the mode of operation of the second switching element. The switching device control signal diagram shows the switching of the switching device 204 between the first reference signal 202 and the second reference signal 203. In particular, it shows the switching device control signal applied to the switching device 204 to affect the output of one of the reference signals 202, 203 at any one time.

The changes in the control signal diagrams 513, 514 can be separated and described with respect to the four signal application periods 516A, 516B, 516C, 516D. In this example, the apparatus 200 is configured to provide the switching device control signal 514 to the switching device 204. By the provision of the switching device control signal 514 to the switching device 204, when the switching device control signal 514 is high, the first reference signal is provided as the switching device output signal and when the switching device control signal 514 is low, the second reference signal is provided as the switching device output signal. In this example, the apparatus 200 is further configured to provide the inverting element control signal 513 to the first inverting element 205 and the second inverting element 207. In other embodiments, a second switching element control signal, different from the first switching element control signal 513, may be applied to the second switching element 207. By the provision of the inverting element control signal 513 to the first inverting element 205, when the inverting element control signal 513 is high, the first inverting element 205 does not provide for inversion of the polarity of the switching device output signal and when the inverting element control signal 513 is low, the first inverting element 205 does provide for inversion of the polarity of the switching device output signal. By the provision of the inverting element control signal 513 to the second inverting element 207, when the inverting element control signal 513 is high, the second inverting element 207 does not provide for inversion of the polarity of the ADC output signal and when the inverting element control signal 513 is low, the second inverting element 207 does provide for inversion of the polarity of the ADC output signal.

During each of the signal application periods 516A, 516B, 516C, 516D, each of the sub-ADCs in the plurality of sub-ADCs are successively provided with the respective first, second, third or fourth ADC input signals by the apparatus 200. In FIGS. 5A-5D, Ni denotes the number of sub-ADCs in the plurality of ADCs and Nc denotes the duration over which each of the sub-ADCs are provided with the first through fourth ADC input signals by the apparatus 200 during each corresponding signal application period. As such, the duration of each signal application period 516A, 516B, 516C, 516D is Nc·Ni. Thus, in examples where there is only a single ADC, the duration of each signal application period may be equal to Nc. Each of the first reference signal 202 and the second reference signal 203 are applied to the ADC 201 for a total of two signal application periods 516A, 516B, 516C, 516D and, thus, the duration over the four signal application periods that each of these signals are applied is equal to 2·Nc·Ni. Each of the sub-ADCs may comprise a predetermined sampling period which corresponds to the minimum duration over which the sub-ADC must receive a signal in order to provide for a corresponding output. The duration over which each of the sub-ADCs are provided with the first through fourth ADC input signals by the apparatus, Nc, may be equal to at least the duration of one sampling period. In one or more embodiments, the duration over which each of the sub-ADCs are provided with the first through fourth ADC input signals by the apparatus, Nc, may be equal to at least two, three, four or any other number of sampling periods. As such, the duration of each signal application period may be equal to one or more sampling periods multiplied by the number of sub-ADCs in the plurality of sub-ADCs, Ni. It will be appreciated, therefore, that each signal application period may be equal to one, two, or more sampling periods of an ADC in a system where there is only a single ADC.

FIGS. 5A-5D show the output signals of each component along the segments of the apparatus 200 based on the time segment 517 of the figure. Summaries of the signals received over each of the accumulated signal application periods by the offset calibration accumulator 206 and the gain calibration accumulator 208 are provided in each figure, together with a result of the summation of the accumulated signals.

FIG. 5A shows the operation of the apparatus 200 during a first signal application period, as shown by the time segment 517, which highlights the first signal application period 516A. During this first signal application period 516A, the apparatus 200 provides the switching device 204 with a high switching device control signal 514. As such, the switching device is configured to provide the first reference signal 202 as the switching device output signal. The apparatus 200 is also configured to provide the first inverting element 205 with a high inverting element control signal. As such, the first inverting element 205 is configured to not provide for inversion of the polarity of the switching device output signal.

During conversion of the analog signal received by the ADC 201 to a digital signal, a gain, g1, and an offset, o1, are applied to the first reference signal 202, thereby providing an ADC output signal during the first signal application period that can be expressed as g1·REF1+o1. It will be appreciated that the application of a gain to a signal can be mathematically represented as a multiplication of said signal and that the introduction of an offset can be mathematically represented as an addition to said signal. It will further be appreciated that, while the first reference signal is referred to as REF1 both before and after conversion by the ADC 201, the ADC 201 will still perform the operation of converting an analog REF1 signal to digital REF1 signal. However, for the purpose of the operation of this apparatus 200, there is no need to differentiate between the analog and the digitised signals but instead only a need to highlight the gains and offsets applied by digitisation.

The ADC output signal, g1·REF1+o1 may be provided directly to the offset calibration accumulator 206. In this example, the ADC output signal is also provided to the second inverter element 207. The apparatus 200 is configured to provide the second inverting element 207 with a high inverting element control signal 513. As such, the second inverting element 207 is configured to not provide for inversion of the polarity of the ADC output signal. As such, the gain calibration signal is equal to g1·REF1+o1. In this example embodiment, the first inverting element 205 and the second inverting element 207 are controlled by the same inverting element control signal 513, Schop, however, in another embodiment the inverting elements 205, 207 may be controlled by different control signals.

Figure 5B:
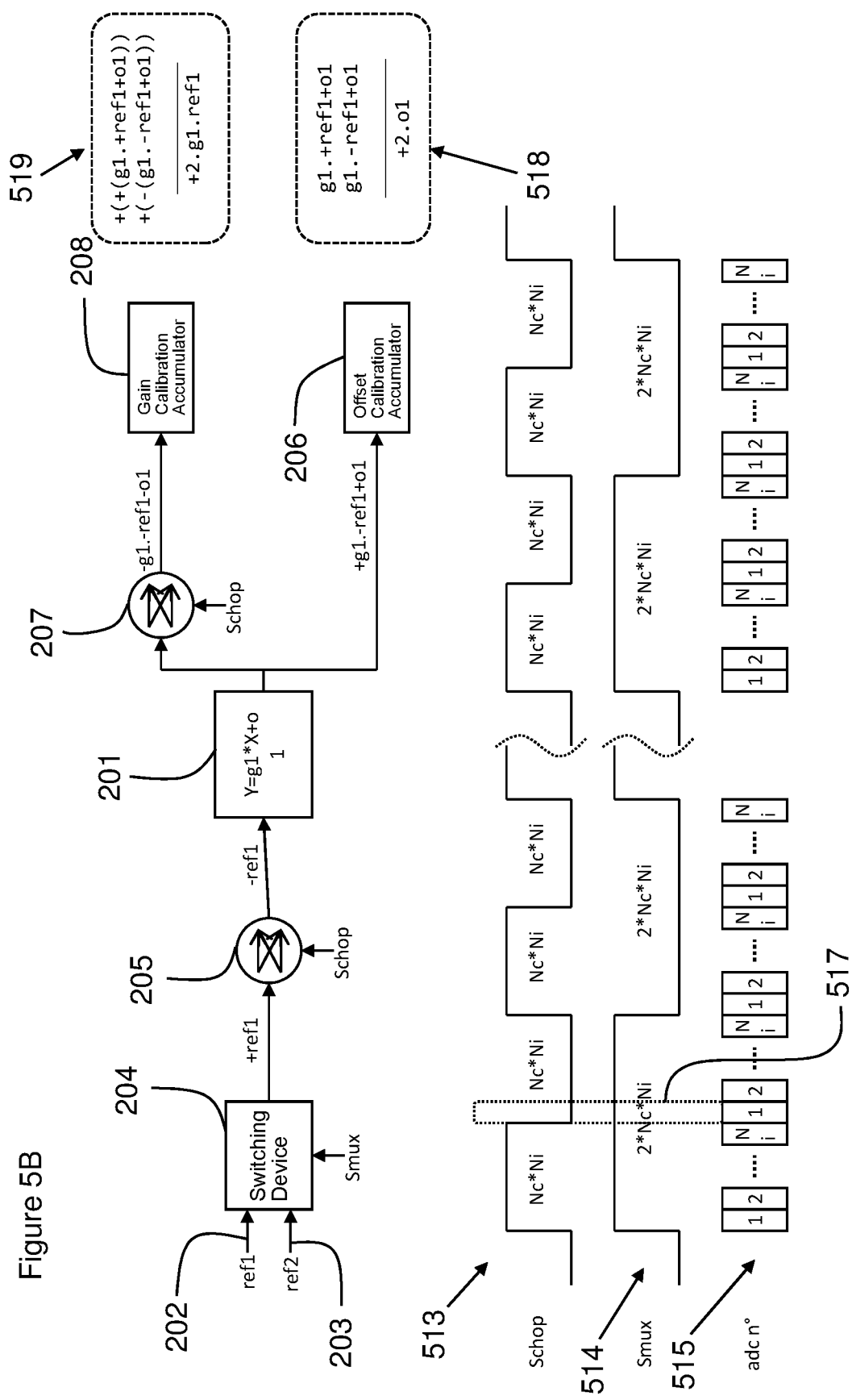

FIG. 5B shows the operation of the apparatus 200 during a second signal application period, as shown by the time segment 517 in the timing diagrams 513, 514, 515. During this second signal application period 516B, the apparatus 200 provides the switching device 204 with a high switching device control signal 514. As such, the switching device is configured to provide the first reference signal 202 as the switching device output signal. The apparatus 200 is configured to provide the first inverting element 205 with a low inverting element control signal. As such, the first inverting element 205 is configured to provide for inversion of the polarity of the switching device output signal. It will be appreciated that the inversion of the polarity of a signal can be represented by the mathematical operation of negating the number, i.e. making it negative or multiplying the signal by −1.

The ADC output signal, −g1·REF1+o1 may be provided directly to the offset calibration accumulator 206. As such, the summation at the end of the second signal application period 516B of the offset calibration accumulator is equal to 2·o1, as shown at 518 in FIG. 5B, due to the cancellation of the reference signals. In particular, (g1·+REF1+o1) plus (g1·REF1+o1) equals +2·o1, as shown at 518 of FIG. 5B.

The apparatus 200 is configured to provide the second inverting element 207 with a low inverting element control signal 513. As such, the second inverting element 207 is configured to provide for inversion of the polarity of the ADC output signal. In this example, the gain calibration signal is then equal to −(−g1·REF1+o1). As such, the summation at the end of the second signal application period of the gain calibration accumulator 208 is equal to 2·g1·REF1, due to the cancellation of the offset values. In particular, +(+(g1·+REF1+o1)) plus +(−(g1·−REF1+o1)) equals +2·g1·REF1, as shown at 519 of FIG. 5B.

Figure 5C:
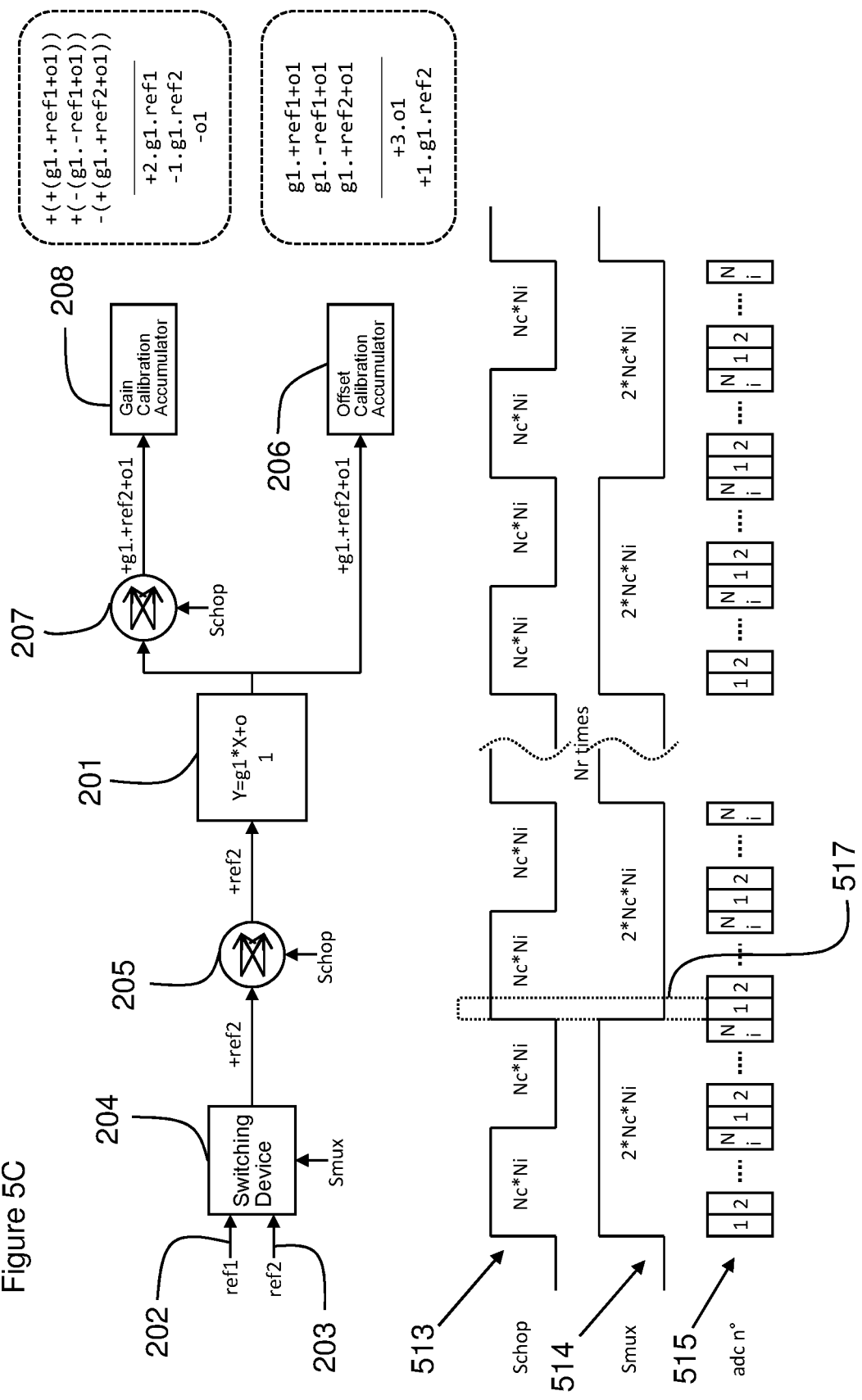

FIG. 5C shows the operation of the apparatus 200 during a third signal application period 516C, as shown by the time segment 517 in the timing diagrams 513, 514, 515. During this third signal application period 516C, the apparatus 200 provides the switching device 204 with a low switching device control signal 514. As such, the switching device 204 is configured to provide the second reference signal 203 as the switching device output signal. The apparatus 200 is configured to provide the first inverting element 205 with a high inverting element control signal 513. As such, the first inverting element 205 is configured to not provide for inversion of the polarity of the switching device output signal. As such, the first inverting element provides the second reference signal to the ADC 201 as the third ADC input signal.

The ADC output signal, g1·REF2+o1 may be provided directly to the offset calibration accumulator 206. As such, the summation at the end of the third signal application period of the offset calibration accumulator 206 is equal to 3·o1+g1·REF2, as shown at 518 of FIG. 5C.

The apparatus 200 is configured to provide the second inverting element 207 with a high inverting element control signal 513. As such, the second inverting element 207 is configured to not provide for inversion of the polarity of the ADC output signal. Thus, the gain calibration signal is equal to g1·REF2+o1. In some examples, such as the example shown in FIGS. 5C and 5D, the gain calibration accumulator 208 may be configured to subtract the signals received during the third and fourth signal application periods from the signals accumulated during the first and second signal application periods. Thus, in this example, the summation at the end of the third signal application period of the gain calibration accumulator 208 is equal to: 2·g1·REF1−g1·REF2−o1, as shown at 519 of FIG. 5C. In some examples, subtracting the signals accumulated during the third and fourth signal application periods from those accumulated during the first and second signal application periods may be particularly advantageous in order to avoid overloading the maximum capacity of the gain calibration accumulator 208. Alternatively, the gain calibration accumulator 208 may be configured to add the signals received during the third and fourth signal application periods to the signals accumulated during the first and second signal application periods. In such an example, the summation at the end of the third signal application period is equal to 2·g1·REF1+g1·REF2+o1.

Figure 5D:
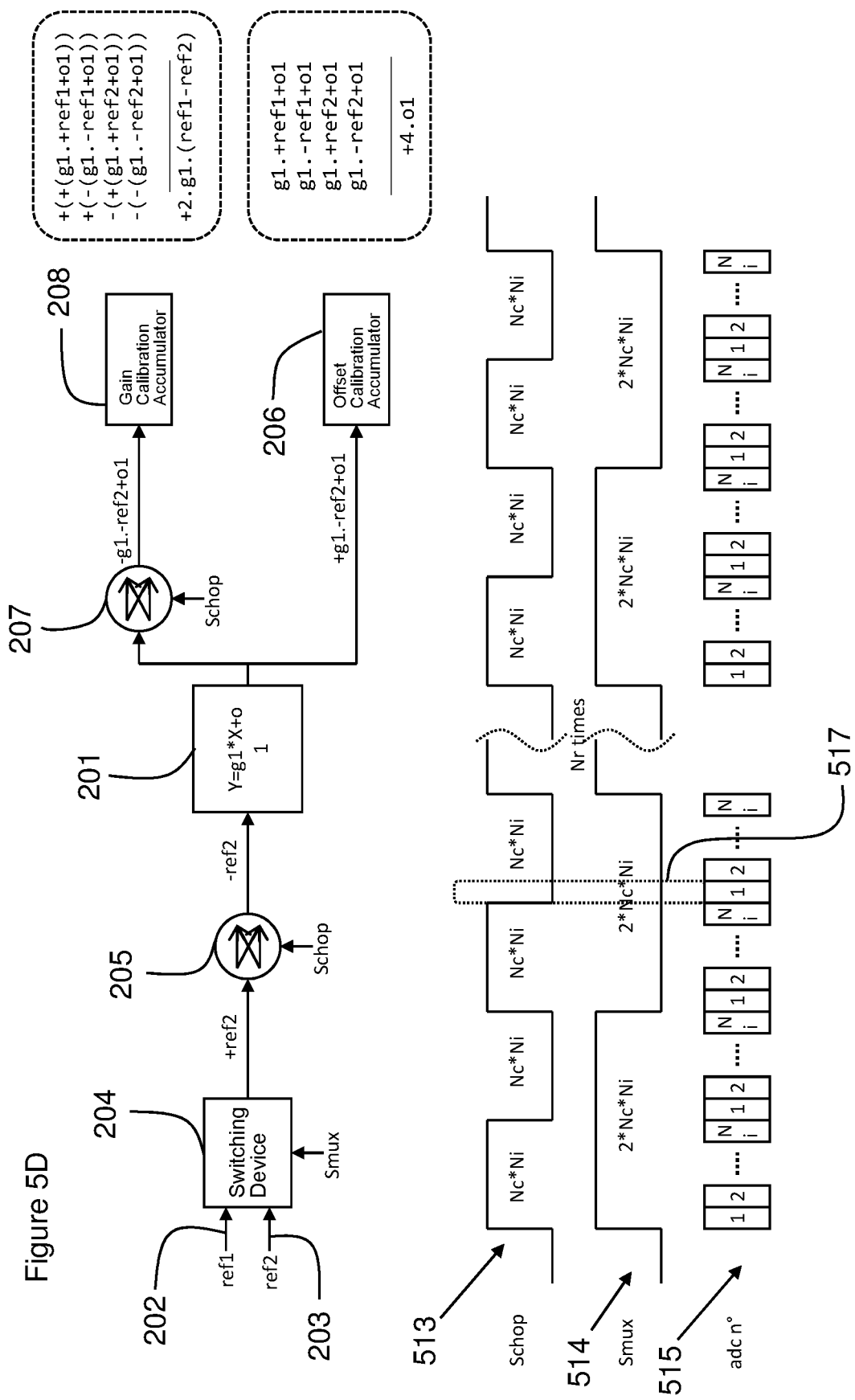

FIG. 5D shows the operation of the apparatus 201 during a fourth signal application period, as shown by the time segment 517 in the timing diagrams 513, 514, 515. During this fourth signal application period 516D, the apparatus 200 provides the switching device 204 with a low switching device control signal 514. As such, the switching device 204 is configured to provide the second reference signal 203 as the switching device output signal. The apparatus 200 is configured to provide the first inverting element 205 with a low inverting element control signal 513. As such, the first inverting element 205 is configured to provide for inversion of the polarity of the switching device output signal, thereby providing the fourth ADC input signal of −REF2.

The ADC output signal, −g1·REF2+o1 may be provided directly to the offset calibration accumulator 206. As such, the summation at the end of the fourth signal application period of the offset calibration accumulator 206 is equal to 4·o1, due to the cancellation of the reference signals. In particular, g1·+REF1+o1 plus g1·−REF1+o1 plus g1·−REF2+o1 plus g1·−REF2+o1 equals 4·o1, as shown at 518 of FIG. 5D.

Either the offset calibration accumulator or a controller may provide for performing the mathematical operation of dividing this signal by 4, thereby providing an offset calibration value of o1.

The apparatus 200 is configured to provide the second inverting element 207 with a low inverting element control signal 513. As such, the second inverting element 207 is configured to provide for inversion of the polarity of the ADC output signal. Thus, the gain calibration signal is equal to −(g1·−REF2+o1). In the example where the gain calibration accumulator 208 is configured to subtract the signals accumulated during the third and fourth signal application periods from those accumulated during the first and second signal application periods, the summation at the end of the fourth signal application period 516D of the gain calibration accumulator is equal to 2g1·(REF1−REF2). In particular, +(+(g1·+REF1+o1)) plus +(−(g1·−REF1+o1)) plus −(+(g1·+REF2+o1)) plus −(−(g1·−REF2+o1)) equals 2g1·(REF1−REF2). Alternatively, where the accumulator adds the signals accumulated during the third and fourth signal application periods to those accumulated during the first and second signal application periods, the summation at the end of the fourth signal application period 516D of the gain calibration accumulator is equal to 2g1·(REF1+REF2).

The gain calibration accumulator 208, or a separate controller, may then provide for determination of the gain calibration value by, in the case where the signals accumulated during the third and fourth signal application periods are subtracted from those accumulated during the first and second signal application periods, performing the mathematical operation of dividing the accumulated signal by 2·(REF1−REF2). Alternatively, in the case where the signals accumulated during the third and fourth signal application periods are added to those accumulated during the first and second signal application periods, the mathematical operation is dividing the total accumulated signal by 2·(REF1+REF2). It can be seen that the gain calibration value is, therefore, based on the accumulated signals over the first through fourth signal application periods. In order to determine the gain calibration value, a mathematical operation is performed, such as the division by an appropriate scalar (2) and combination of the first and second reference signals, based on how the signals were accumulated (REF1−REF2) or (REF1+REF2).

The gain calibration accumulator 208 and the offset calibration accumulator 206 may be connected to a controller such that the accumulated signals collected by the accumulators 206, 208 can be provided to the controller. In some embodiments, each of the gain calibration accumulator 208 and the offset calibration accumulator 206 may be connected to respective controllers. The one or more controllers may be configured to perform any required mathematical operations on the accumulated signals in order to provide for the determination of the offset calibration value and the gain calibration value. For example, in the case of the offset calibration value, the controller may be configured to, after the fourth signal application period, divide the accumulated offset calibration value signal by 4, in order to provide for the offset calibration value, o1. In the case of the gain calibration value, the controller may be configured to, after the fourth signal application period, divide the accumulated offset calibration by two times the known difference between the first reference signal 202 and the second reference signal 203, i.e. 2·(REF1−REF2) or 2·(REF1+REF2), in order to provide for the gain calibration value, g1. In some examples, the gain calibration accumulator 208 and the offset calibration accumulator 206 or the controller may be configured to, in addition to performing any required mathematical operations described above, accumulate a plurality of cycles of the four signal application periods and, after the final cycle, divide the total accumulated signal by the total number of cycles. This, thereby, provides for time-averaged calibration values. Time-averaged calibration values determined over a plurality of cycles of signal application periods may provide for particularly effective noise cancelling by the averaging-out of random noise signals in order to provide for improved gain and offset calibration values. A single cycle of signal application periods may be defined as the completion of the first signal application period, the second signal application period, the third signal application period and the fourth signal application period in any order.

The one or more controllers may be used to control one or more ADCs 201 or sub-ADCs based on the respective offset and gain calibration values. For example, the one or more controllers may be configured to provide for control and gain of each of a plurality of sub-ADCs, or of a single ADC in response to determining that an ADC 201 is applying a gain which is above or below acceptable operating parameters. In another embodiment, the controller may be configured to provide for control of a deinterleaver 311 such that the deinterleaver 311 can provide for matched reconstitution of a signal regardless of variance between the offset and gain differences between sub-ADCs 201*a*, 201*b* in a time interleaved ADC system 300.

Figure 6:
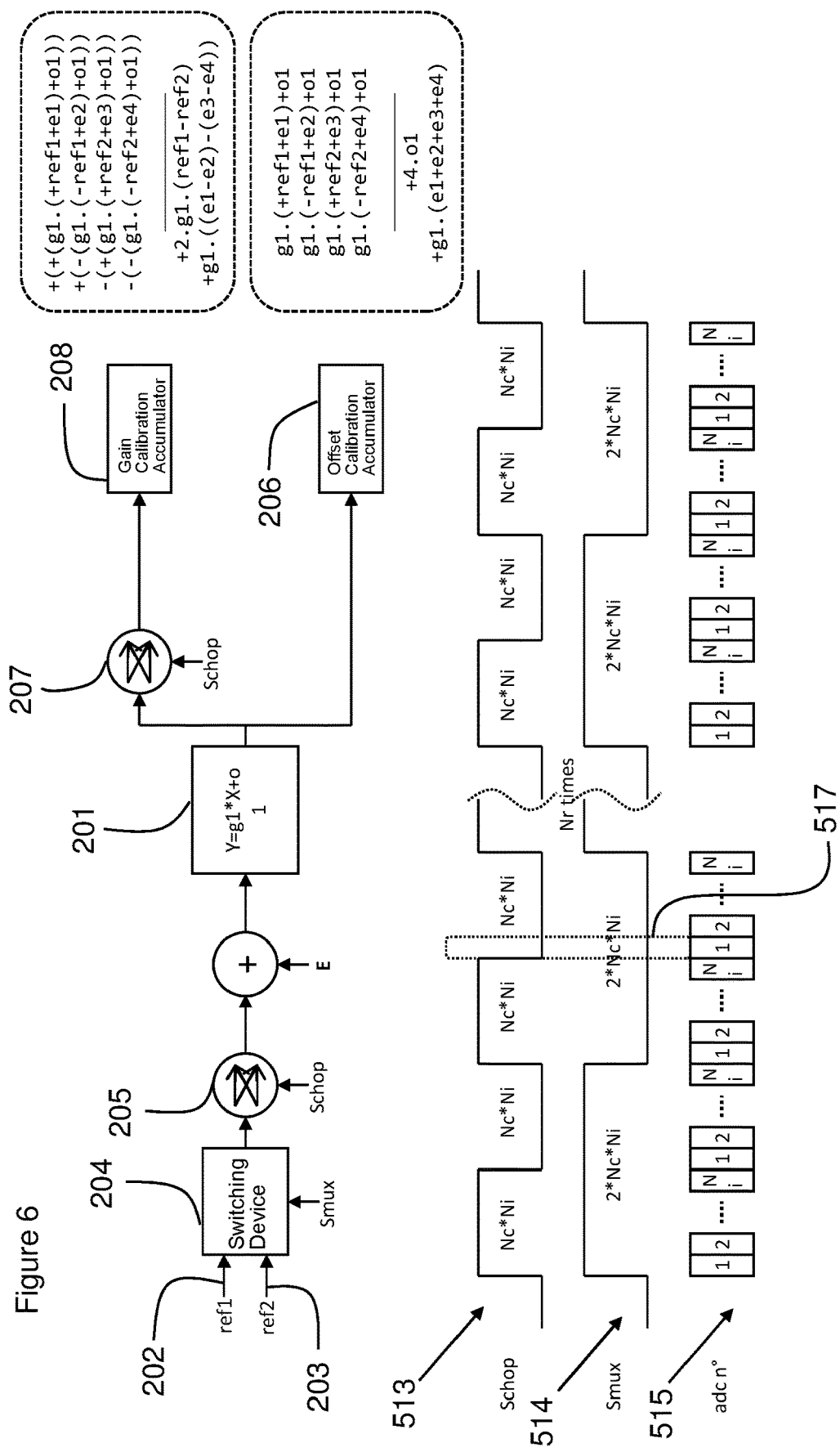
FIG. 6 shows an example embodiment of an apparatus of FIG. 2 wherein a noise signal is introduced into the system after the first signal inverting element.
Figure 7:
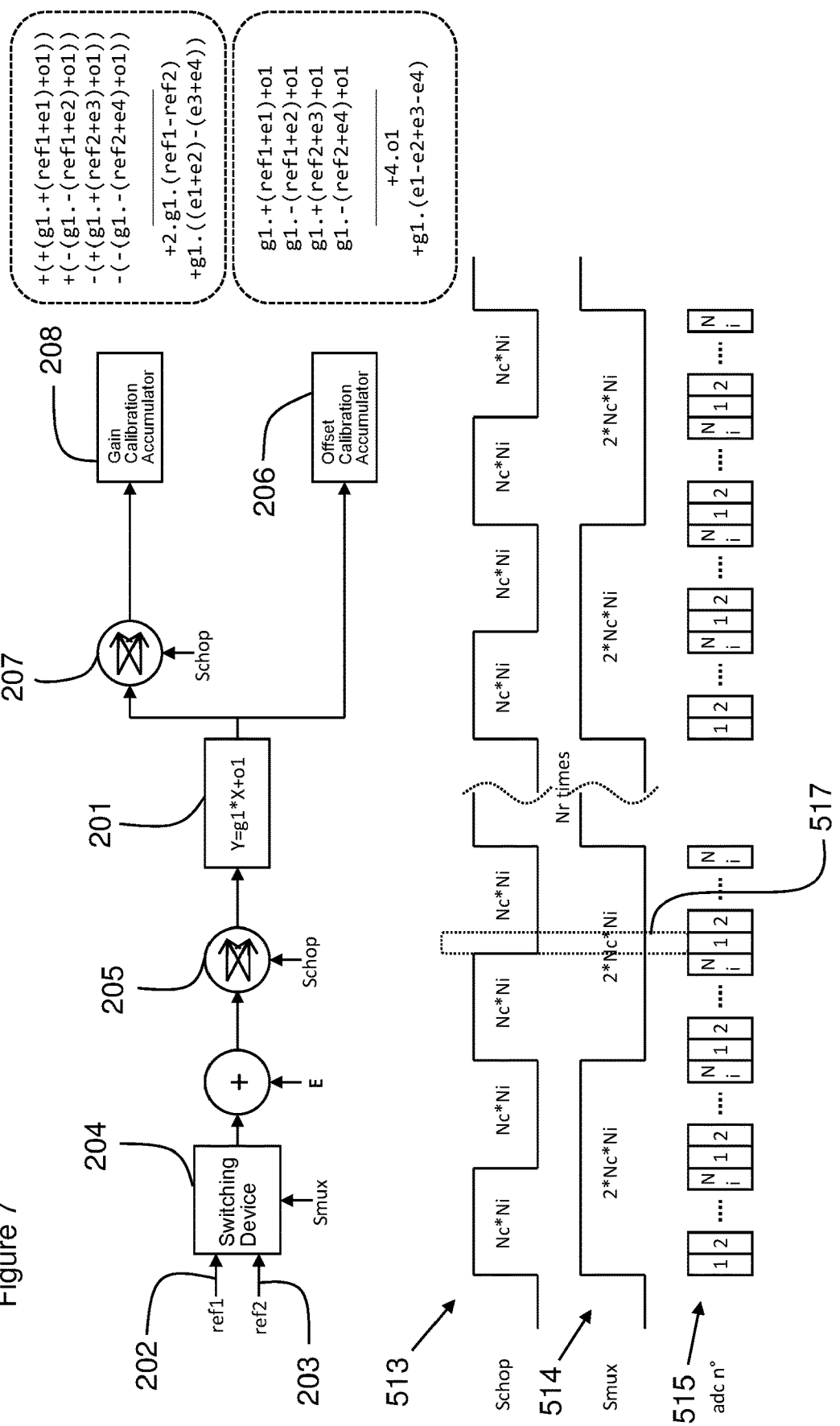
FIG. 7 shows an example embodiment of an apparatus of FIG. 2 wherein a noise signal is introduced into the system after the switching device.

When it comes to ADC calibration, one particular problem can be the effect of noise on the determined calibration value or values. Noise can cause errors and inaccuracies in determined calibration values. The noise may be generated by any of the components or elements of the apparatus, the ADC, or by external factors. The apparatus for determining the offset and gain calibration values described in relation to FIGS. 5A-5D may be particularly advantageous for reducing the effects of noise on determined gain and offset calibration values. FIGS. 6 and 7 show the apparatus 200 and ADC 201 of FIGS. 5A-5D but also show the effect of a noise signal added to the signal after the first inverting element 205 and before the first inverting element 205 respectively. In these examples, the noise signal introduced into the system during the first signal application period is denoted as e1, the noise signal introduced into the system during the second signal application period is denoted as e2, during the third signal period is e3 and during the fourth signal application period is e4.

In each case, i.e. if the noise signal is introduced before or after the first inverting element 205, the effect of the noise signal on the calibration values may be particularly effectively reduced when the duration of each of the signal application periods is short compared to the rate of change of the noise signal. i.e. the rate of switching between the signal application periods is faster than the rate of change of the noise signal. If the rate of switching between the signal application periods is faster than the rate of change of the noise signal, then the degree of variance in the noise signals, e1-e4, will be small and, as such, it will be possible to provide for the cancellation of these signals, as described in detail with relation to FIGS. 6 and 7.

FIG. 6 shows an example embodiment wherein a noise signal is introduced into the apparatus 200 after the first inverting element 205. Other than the introduction of the noise signal, the remainder of features of FIG. 6 are identical to those of FIGS. 5A-5D. FIG. 6 only shows the final accumulation of signals at the end of the fourth signal application period, i.e. the end of the signal application cycle.

It can be seen that, for the offset calibration value, the final accumulated signal is equal to $4 \cdot o1 + g1 \cdot (e1 + e2 + e3 + e4)$. Due to its random nature, the cumulative noise signal $g1 \cdot (e1 + e2 + e3 + e4)$ may be reduced by averaging of the signals accumulated over a plurality of signal application cycles. In this way, multiple averaged measurements of $(e1 + e2 + e3 + e4)$ will tend towards zero.

For the gain calibration value, the final accumulated signal received by the gain calibration accumulator 208 is equal to: $2 \cdot g1 \cdot (REF1 - REF2) + g1 \cdot ((e1 - e2) - (e3 - e4))$. In this instance, because the rate of switching between the signal application periods is fast compared to the rate of change of the noise signal, e1 may be approximately equal to e2 and e3 may be approximately equal to e4. As such, e1−e2 and e3−e4 may cancel to zero or a substantially negligible noise signal, thereby providing for an improved gain signal estimation, despite the introduction of a noise signal into the apparatus 200. Due to its random nature, the cumulative noise signal $g1 \cdot ((e1 - e2) - (e3 - e4))$ may be further reduced by averaging of the signals accumulated over a plurality of signal application cycles.

FIG. 7 shows an example embodiment wherein a noise signal is introduced into the apparatus 200 before the first inverting element 205. Other than the introduction of the noise signal, the remainder of the features of FIG. 7 are identical to those in FIGS. 5A-5D. FIG. 7 only shows the final accumulation of signals at the end of the fourth signal application period.

It can be seen that, for the offset calibration value, the final accumulated signal is equal to $4 \cdot o1 + g1 \cdot (e1 - e2 + e3 - e4)$. Because the rate of switching between the signal application periods is fast compared to the rate of change of the noise signal, e1 may be approximately equal to e2 and e3 may be approximately equal to e4. As such, e1−e2 and e3−e4 may cancel to zero or a substantially negligible noise signal, thereby providing or an improved offset calibration, despite the introduction of a noise signal into the apparatus 200. Due to its random nature, the cumulative noise signal $g1 \cdot (1 - e2 + e3 - e4)$ may be further reduced by averaging of the signals accumulated over a plurality of signal application cycles.

For the gain calibration value, the final accumulated signal received by the gain calibration accumulator is equal to: $2 \cdot g1 \cdot (REF1 - REF2) + g1 \cdot ((e1 + e2) - (e3 + e4))$. Because the rate of switching between the signal application periods is fast compared to the rate of change of the noise signal, e1+e2 may be approximately equal to e3+e4. As such, (e1+e2)−(e3+e4) may cancel to zero or a substantially negligible noise signal, thereby providing for an improved gain signal estimation, despite the introduction of a noise signal into the apparatus 200. Due to its random nature, the cumulative noise signal $g1 \cdot ((e1 + e2) - (e3 + e4))$ may be further reduced by averaging of the signals accumulated over a plurality of signal application cycles.

While embodiments have been shown in FIGS. 6 and 7 wherein noise signals have been introduced only either before the first inverting element 205 or after the first inverting element 205, it will be appreciated that noise signals may be introduced into the apparatus any of before, after or by the first inverting element 205. In such an embodiment, the noise signals will still cancel as described individually in relation to FIGS. 6 and 7.

Figure 8:
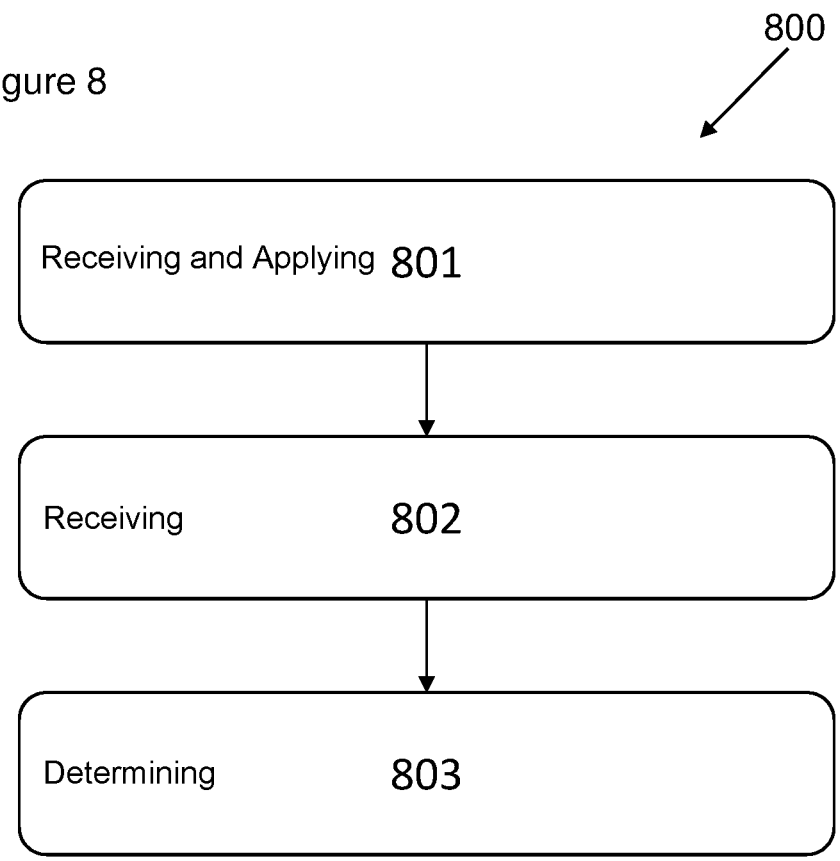
FIG. 8 shows an example embodiment of a method of the present disclosure.

FIG. 8 shows an example method 800 according to the present disclosure. The method 800 comprises the steps of receiving 801 a first reference signal and a second reference signal and, based on the first reference signal and the second reference signal, applying to the ADC, over four separate application periods, four different ADC input signals. These signals comprise: over the first signal application period, a first ADC input signal comprising the first reference signal; over the second signal application period, a second ADC input signal, the second ADC input signal having a substantially equal magnitude and an inverse polarity to the first ADC input signal; over the third signal application period, a third ADC input signal comprising the second reference signal; and over the fourth signal application period, a fourth ADC input signal, the fourth ADC input signal having a substantially equal magnitude and an inverse polarity to the third ADC input signal. The method 800 further comprises the steps of receiving 802 an ADC output signal of the ADC over the four signal application periods and determining 803 the one or more calibration values based, at least in part, on an average of the ADC output signal over the four signal application periods.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments, the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An apparatus for determining one or more calibration values of an analog-to-digital converter, ADC, the apparatus comprising:
    a first input configured to receive a first reference signal; and
    a second input configured to receive a second reference signal,
    wherein the apparatus is configured to, based on the first reference signal and the second reference signal, apply to the ADC, over four separate signal application periods, the following:
        over a first signal application period, a first ADC input signal comprising the first reference signal;
        over a second signal application period, a second ADC input signal, the second ADC input signal having a substantially equal magnitude and an inverse polarity to the first ADC input signal;
        over a third signal application period, a third ADC input signal comprising the second reference signal; and
        over a fourth signal application period, a fourth ADC input signal, the fourth ADC input signal having a substantially equal magnitude and an inverse polarity to the third ADC input signal, and
    wherein the apparatus configured to determine the one or more calibration values based, at least in part, on an ADC output signal of the ADC over the four signal application periods.

2. The apparatus of claim 1, wherein the one or more calibration values comprise one or more of an offset calibration value and a gain calibration value, wherein:
    (i) the offset calibration value is calculated based on a sum of the ADC output signal over at least the four signal application periods; and
    (ii) the gain calibration value is calculated based on a sum of:
        (a) a signal comprising one of the ADC output signal over the first signal application period and the ADC output signal over the second signal application period and a signal having a substantially equal magnitude and an inverse polarity to the other of the ADC output signal over the first signal application period and the ADC output signal over the second signal application period; and
        (b) a signal comprising one of the ADC output signal over the third signal application period and the ADC output signal over the fourth signal application period and a signal having a substantially equal magnitude and an inverse polarity to the other of the ADC output signal over the third signal application period and the ADC output signal over the fourth signal application period.

3. The apparatus of claim 1, wherein each of the signal application periods are substantially equal in duration.

4. The apparatus of claim 1 wherein:
    each of the first through fourth signal application periods have a corresponding duration;
    the ADC has a sampling period; and
    the duration of each of the first through fourth signal application periods is equal to at least two signal sampling periods of the ADC.

5. The apparatus of claim 1 comprising a switching device configured to receive the first reference signal and the second reference signal, the switching device configured to provide a switching device output signal wherein, over the first and second signal application periods, the switching device output signal comprises the first reference signal and over the third and fourth signal application periods, the switching device output signal comprises the second reference signal.

6. The apparatus of claim 5 comprising a first signal inverting element configured to provide each of the ADC input signals based on the switching device output signal wherein:
during the second signal application period, the first signal inverting element is configured to provide the second ADC input signal by inverting the polarity of the first reference signal received from the switching device; and
during the fourth signal application period, the first signal inverting element is configured to provide the fourth ADC input signal by inverting the polarity of the second reference signal received from the switching device.

7. The apparatus of claim 2 comprising a second signal inverting element configured to provide a gain calibration signal, for use in determination of one of the calibration values, based on the ADC output signal wherein:
during one of the first and the second signal application period, the second signal inverting element is configured to provide the gain calibration signal by inverting the polarity of the ADC output signal; and
during one of the third and the fourth signal application period, the second signal inverting element is configured to provide the gain calibration signal by inverting the polarity of the ADC output signal.

8. The apparatus of claim 7 comprising a gain calibration accumulator configured to sum the gain calibration signal over the four signal application periods in order to provide for the gain calibration value.

9. The apparatus of claim 1 comprising an offset calibration accumulator configured to sum the ADC output signal over the four signal application periods in order to provide for the offset calibration value.

10. The apparatus of claim 1, wherein the ADC comprises a plurality of sub-ADCs, wherein:
during the first signal application period, the apparatus is configured to provide the first ADC input signal to each of the plurality of sub-ADCs and to receive the ADC output signal from each of the sub-ADCs;
during the second signal application period, the apparatus is configured to provide the second ADC input signal to each of the plurality of sub-ADCs and to receive the ADC output signal from each of the sub-ADCs;
during the third signal application period, the apparatus is configured to provide the third ADC input signal to each of the plurality of sub-ADCs and to receive the ADC output signal from each of the sub-ADCs; and
during the fourth signal application period, the apparatus is configured to provide the fourth ADC input signal to each of the plurality of sub-ADCs and to receive the ADC output signal from each of the sub-ADCs.

11. The apparatus of claim 10, wherein the plurality of sub-ADCs comprises the sub-ADCs of a time interleaved ADC system.

12. An ADC system comprising an apparatus of claim 1 and a plurality of sub-ADCs, wherein each of the plurality of sub-ADCs is configured to be selectively provided with an input signal during operation and are collectively configured to provide for time interleaved analog-to-digital conversion of the input signal by use of the sub-ADCs and at least one of the sub-ADCs is further configured to be provided with the first reference signal and the second reference signal of the apparatus during a calibration operation.

13. The ADC system of claim 12, wherein the apparatus is configured to provide each of the sub-ADCs of the plurality of sub-ADCs with the first through fourth ADC input signals of the apparatus during the calibration operation.

14. The ADC system of claim 13, wherein, during operation, the apparatus is configured to select which of the plurality of sub-ADCs to provide the input signal to at random and, during the calibration operation, the apparatus configured to provide each of the sub-ADCs with the first through fourth ADC input signals according to a predetermined sequence.

15. A method for determining one or more calibration values of an analog-to-digital converter, ADC, the method comprising:
receiving a first reference signal and a second reference signal and, based on the first reference signal and the second reference signal, applying to the ADC, over four application periods, the following:
over the first signal application period, a first ADC input signal comprising the first reference signal;
over a second signal application period, a second ADC input signal, the second ADC input signal having a substantially equal magnitude and an inverse polarity to the first ADC input signal;
over a third signal application period, a third ADC input signal comprising the second reference signal; and
over a fourth signal application period, a fourth ADC input signal, the fourth ADC input signal having a substantially equal magnitude and an inverse polarity to the third ADC input signal,
summing an ADC output signal of the ADC over the four signal application periods, and
determining the one or more calibration values based, at least in part, on the sum of the ADC output signal over the four signal application periods.

* * * * *